(12) United States Patent
Klemmer et al.

(10) Patent No.: US 6,265,902 B1
(45) Date of Patent: Jul. 24, 2001

(54) SLIP-DETECTING PHASE DETECTOR AND METHOD FOR IMPROVING PHASE-LOCK LOOP LOCK TIME

(75) Inventors: Nikolaus Klemmer, Apex; Steven L. White, Raleigh, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/432,897

(22) Filed: Nov. 2, 1999

(51) Int. Cl.[7] ............................................. H03D 3/00
(52) U.S. Cl. ..................... 327/2; 327/3; 327/7; 327/12; 324/76.77
(58) Field of Search ................... 327/2, 3, 5, 7, 327/8, 10, 12, 18, 22, 24, 31, 35; 324/76.77, 76.78, 76.79; 375/359, 360

(56) References Cited

U.S. PATENT DOCUMENTS

| | | |
|---|---|---|
| 3,723,889 | 3/1973 | Oberst ................................. 327/10 |
| 4,901,026 * | 2/1990 | Phillips et al. ...................... 327/10 |
| 4,902,920 | 2/1990 | Wolaver .............................. 327/12 |
| 5,164,838 * | 11/1992 | Okuda ................................ 358/326 |
| 5,790,613 * | 8/1998 | Tateishi .............................. 375/376 |

OTHER PUBLICATIONS

Turczynski, Janusz et al. *Selected Digital Circuits,* Wydawnictwa Komunikacji i Laznośći, 90–96. Warsaw, 1983.

* cited by examiner

*Primary Examiner*—Terry D. Cunningham
*Assistant Examiner*—An T. Luu
(74) *Attorney, Agent, or Firm*—Wood, Phillips, VanSanten, Clark & Mortimer

(57) ABSTRACT

An improved digital phase detector is provided for detecting and compensating for a cycle slip between a reference signal and a frequency source signal, the reference and frequency source signals each comprising pulses, each pulse defined by a leading edge and a trailing edge. The digital phase detector includes a detector circuit for detecting a cycle slip where two successive leading edges of one of the reference and frequency source signals are received before a leading edge of the other signal is received. An output circuit is operatively coupled to the detector circuit for developing a correction signal responsive to said detecting.

35 Claims, 4 Drawing Sheets

SLIP-DETECTING PHASE DETECTOR AND METHOD FOR IMPROVING PHASE-LOCK LOOP LOCK TIME

FIELD OF THE INVENTION

This invention relates to phase detectors, and more particularly, a digital phase detector with slip detection capability for reducing phase-lock loop lock time.

BACKGROUND OF THE INVENTION

A phase-locked loop (PLL), in one form, includes a phase detector, a charge pump, a loop filter, a voltage controlled oscillator (VCO) a frequency divider, and a reference frequency signal source. The PLL synthesizes a frequency source signal, for example the VCO, based on the reference frequency signal source (reference signal), for example a crystal oscillator. The phase detector keeps the frequency source and reference signals at its input equal in frequency and phase by determining a phase mismatch between the divided frequency source and reference signals, and activating the charge pump based on the amount of phase mismatch. Because of device physics, loop dynamics and system architecture, the correction cannot be made instantaneously, resulting in a finite time between the detected phase mismatch between the reference and frequency source signals and the correction of the frequency source signal. The time for the frequency source signal to achieve its intended frequency (reference frequency) is called the "lock time" of the PLL.

A digital phase detector may consist of flip-flops clocked by the edges of derivatives of the reference and frequency source signals. If one edge arrives before the other, a charge is transferred to or from a loop filter that changes the frequency of the frequency source to align the edges. The amount of charge transferred (the amount of correction) depends on the time difference between the edges of the reference and frequency source signals. However, the operating range of the digital phase detector is only $-2\pi$ to $2\pi$. An edge of the reference signal must be received for each edge of the frequency source signal for proper correction to occur. If the difference between the reference and frequency source signals is too great, two edges may appear at an input before the corresponding edge arrives at the other input. Such a situation is called a cycle slip, and leads to an improper correction, causing increased PLL lock time.

One solution to overcome the cycle slip is to extend the range of the digital phase detector. When extending the range, edges of the reference and frequency source signals are each accounted for, and as long as one input of the detector has received more edges than the other input, a correction is enabled. However, a disadvantage of simply extending the range of the phase detector is the increased overshoot in the frequency source control voltage. In voltage-limited applications, the tuning sensitivity of the voltage-controlled oscillator must be increased, resulting in higher noise, or the control voltage will reach a limit where it clips. Should the control voltage clip, the improvements in PLL lock time from using the extended range digital phase detector would be lost or even reversed.

The present invention is directed to overcoming one or more of the problems discussed above in a novel and simple manner.

SUMMARY OF THE INVENTION

In accordance with the invention, there is disclosed a digital phase detector (PD) having a slip detection circuit for detecting and compensating for a cycle slip, providing improved phase lock loop (PLL) lock time without clipping a control voltage of the voltage controlled oscillator.

In one aspect of the invention, an improved digital phase detector for detecting and compensating for a cycle slip between a reference signal and a frequency source signal, the reference and frequency source signals each comprising pulses, each pulse defined by a leading edge and a trailing edge, includes a detector circuit for detecting a cycle slip where two successive corresponding edges of one of the reference and frequency source signals are received before a respective corresponding edge of the other signal is received. An output circuit is operatively coupled to the detector circuit for developing a correction signal responsive to detecting a cycle slip.

In one feature of the invention, the detector circuit includes a PD for detecting a first edge of the two successive corresponding edges by detecting reception of one of a first frequency source pulse edge and a first reference signal pulse edge, and for developing a PD frequency-increase signal where the first edge is the first reference signal pulse leading edge, and developing a PD frequency-decrease signal where the first edge is the first frequency source signal pulse edge. A slip detection (SD) circuit is operatively coupled to the phase detector for receiving the reference and frequency source signals, and for detecting a second corresponding edge of the two successive corresponding edges by detecting a second corresponding reference signal edge corresponding to the first reference signal pulse edge while the frequency-increase signal is being provided, and for detecting a second corresponding frequency source pulse edge corresponding to the first frequency source pulse edge while the frequency-decrease signal is being provided. An SD frequency-increase signal is developed when the second corresponding reference signal pulse edge is detected, and an SD frequency-decrease signal is developed when the second corresponding frequency source pulse edge is detected.

In a further feature, the PD includes a pair of edge-triggered resettable flip-flops and the frequency source signal and the reference signal are clock signals for the flip-flops.

In another feature, the SD circuit includes a first counter and a second counter. The cycle slip is detected at the first counter when the second corresponding reference signal pulse edge is received at a first counter clock input while the PD frequency-increase signal is provided at a first counter comparator input, causing the first counter to load a first specified value and to provide the SD frequency-increase signal at a first counter output for the number of corresponding reference signal pulse edges equaling the first specified value. The cycle slip is detected at the second counter when the second corresponding frequency source pulse edge is received at a second counter clock input while the PD frequency-decrease signal is provided at a second counter comparator input, causing the second counter to load a second specified value and to provide the SD frequency-decrease signal at a second counter output for the number of corresponding frequency source pulse edges equaling the second specified value.

In yet a further feature, the first and second counters each have a permit load input, and including a controller coupled to the permit load inputs for allowing the first and second counters to be loaded while the respective counter is counting.

In a further feature, the first and the second counters each include a counter specified value input, and a controller coupled to the specified value inputs provides the first and second specified values.

In a further feature, the correction signal includes at least one of an output frequency-increase signal and an output frequency-decrease signal, and the output circuit includes a first OR logic gate for developing the output frequency-increase signal responsive to the PD frequency-increase signal and the SD frequency-increase signal. The output circuit also includes a second OR logic gate for developing the output frequency-decrease signal responsive to the PD frequency-decrease signal and the SD frequency-decrease signal.

In another feature of the invention, the improved digital PD includes a controller coupled to the detector circuit and the output circuit for controlling duration of the correction signal.

In yet another feature of the invention, the two successive corresponding edges of one of the reference and frequency source signals are two successive leading edges of one of the reference and frequency source, and the respective corresponding edge of the other signal is a leading edge of the other signal.

In another aspect of the invention, an improved digital phase detector for detecting and compensating for a cycle slip between a reference signal and a frequency source signal, the reference signal and the frequency source signal each comprised of pulses defined by leading edges and trailing edges, includes a phase detector for receiving and detecting a phase difference between the reference signal and the frequency source signal, and developing a PD frequency-increase signal where a phase of the frequency source signal is lagging a phase of the reference signal, and a PD frequency-decrease signal where the phase of the frequency source signal is leading the phase of the reference signal. A slip detection circuit is operatively coupled to the phase detector, for receiving the reference signal and the frequency source signal, and for detecting slip between the reference signal and the frequency source signal, the SD circuit developing a SD frequency-increase signal where the phase detector is providing the PD frequency-increase signal and a reference signal pulse edge is detected by the SD circuit, and a SD frequency-decrease signal where the phase detector is providing the PD frequency-decrease signal and a frequency source signal pulse edge is detected by the SD circuit. An output circuit is operatively coupled to the phase detector and SD circuit for developing an output frequency-increase signal responsive to the PD and SD frequency-increase signals, and an output frequency-decrease signal responsive to the PD and SD frequency-decrease signals.

In a feature of the invention, the PD includes a pair of edge-triggered resettable flip-flops and the frequency source signal and the reference signal are clock signals for the flip-flops.

In another feature, the SD circuit includes a first counter and a second counter. Slip is detected at the first counter when a reference signal pulse edge is received at a first counter clock input while the PD frequency-increase signal is provided by the phase detector, causing the first counter to load a first specified value and provide the SD frequency-increase signal at a first counter output for the number of reference signal pulses equaling the first specified value. Slip is detected at the second counter when a frequency source signal pulse edge is received at a second counter clock input while the PD frequency-decrease signal is provided by the phase detector, causing the second counter to load a second specified value and provide the SD frequency-decrease signal at a second counter output for the number of frequency source signal pulses equaling the second specified value.

In a further feature, the first counter includes a first counter specified value input and the second counter includes a second counter specified value input, and a controller is coupled to the first and second counter specified value inputs for providing the first and second specified values respectively.

In still another feature, the first and second counters each have a permit load input, and a controller is coupled to the permit load inputs for allowing the first and second counters to be loaded while the respective counter is counting.

In another feature of the invention, the output circuit includes a first OR logic gate for developing the output frequency-increase signal responsive to the PD frequency-increase signal and the SD frequency-increase signal. The output circuit also includes a second OR logic gate for developing the output frequency-decrease signal responsive to the PD frequency-decrease signal and the SD frequency-decrease signal.

In another aspect of the invention, a method for detecting and compensating for a cycle slip between a reference signal and a frequency source signal, the reference and frequency source signals each comprising pulses, each pulse defined by a leading edge and a trailing edge, includes detecting a cycle slip where two successive corresponding edges of one of the reference and frequency source signals is received before a respective corresponding edge of the other signal. A correction signal is developed responsive to detecting a cycle slip.

In a feature of the invention, the step of detecting a cycle slip includes detecting a first edge of the two successive corresponding edges by detecting reception of one of a first frequency source pulse edge and a first reference signal pulse edge, and developing a PD frequency-increase signal where the first edge is the first reference signal pulse edge, and developing a PD frequency-decrease decrease signal where the first edge is the first frequency source pulse edge. A second corresponding edge of the two successive corresponding edges is detected by detecting a second corresponding reference signal pulse edge corresponding to the first reference signal pulse edge while the PD frequency-increase signal is being provided, and by detecting a second corresponding frequency source pulse edge corresponding to the first frequency source pulse edge while the PD frequency-decrease signal is being provided. An SD frequency-increase signal is developed when the second corresponding reference signal pulse edge is detected, and an SD frequency-decrease signal is developed when the second corresponding frequency source pulse edge is detected.

In a further feature, the step of providing the SD frequency-increase signal includes loading a first counter with a first specified value where the PD frequency-increase signal is detected at a first counter load input while the second corresponding reference signal pulse edge is detected at a first counter clock input. The SD frequency-increase signal is provided at a nonzero output of the first counter while the first counter is counting from the first specified value to zero.

In a further feature yet, the first counter is permitted to reload the first specified value while the first counter is counting from the first specified value to zero.

In a further feature, the step of loading the first counter with the first specified value includes determining the first specified value at a controller coupled to a first counter specified value input, and providing the first specified value to the first counter specified value input.

In a further feature of the invention, the step of providing the SD frequency-decrease signal includes loading a second counter with a second specified value where the PD frequency-decrease signal is detected at a second counter load input while the second corresponding frequency source pulse edge is detected at a second counter clock input. The SD frequency-decrease signal is provided at a second counter nonzero output while the second counter is counting from the second specified value to zero.

In a further feature, the second counter is permitted to reload the second specified value while the second counter is counting from the second specified value to zero.

In a further feature, the step of loading the second counter with the second specified value includes determining the second specified value at a controller coupled to a second counter specified value input, and providing the second specified value to the second counter specified value input.

In a further feature, the step of developing a correction signal includes developing an output frequency-increase signal responsive to the PD frequency-increase signal and the SD frequency-increase signal, and developing an output frequency-decrease signal responsive to the SD frequency-decrease signal and the PD frequency-decrease signal.

In another feature of the invention, developing the correction signal includes controlling the duration of the correction signal.

In yet another feature, detecting a cycle slip where two successive corresponding edges of one of the reference and frequency source signals is received before a respective corresponding edge of the other signal includes detecting the cycle slip where two successive leading edges of one of the reference and frequency source signals is received before a leading edge of the other signal.

In another aspect of the invention, a method of detecting and compensating for a cycle slip between a reference signal and a frequency source signal in a digital phase detector, the reference signal and the frequency source signal each comprised of pulses defined by leading edges and trailing edges, includes receiving a reference signal pulse and a frequency source signal pulse. A phase difference is detected, and a PD frequency-increase signal is provided where a phase of the frequency source signal is lagging a phase of the reference signal, and a PD frequency-decrease signal is provided where the phase of the frequency source signal is leading the phase of the reference signal. An SD circuit frequency-increase signal is developed where the PD frequency-increase signal is being provided and a reference signal pulse edge is detected at an SD reference signal input, and an SD frequency-decrease signal is developed where the PD frequency-decrease signal is being provided and a frequency source signal pulse edge is detected at an SD frequency source signal input. Responsive to the PD frequency-increase signal and the SD frequency-increase signal, an output frequency-increase signal is provided, and responsive to the PD frequency-decrease signal and the SD frequency-decrease signal, an output frequency-decrease signal is provided.

In a feature of the invention, providing the SD frequency-increase signal includes loading a first counter with a first specified value where the PD frequency-increase signal is detected at a first counter load input while the reference signal pulse edge is detected at a first counter clock input, and providing the SD frequency-increase signal at a nonzero output of the first counter while the first counter is counting from the first specified value to zero.

In a further feature, the first counter is permitted to reload the first specified value while the first counter is counting from the first specified value to zero.

In a further feature, loading the first counter with the first specified value includes determining the first specified value at a controller coupled to a first counter specified value input and providing the first specified value to the first counter specified value input.

In another feature of the invention, providing the SD frequency-decrease signal includes loading a second counter with a second specified value where the PD frequency-decrease signal is detected at a second counter load input while the frequency source signal pulse edge is detected at a second counter clock input. The SD frequency-decrease signal is provided at a second counter nonzero output while the second counter is counting from the second specified value to zero.

In a further feature, the second counter is permitted to reload the second specified value while the second counter is counting from the second specified value to zero.

In a further feature, loading the second counter with the second specified value includes determining the second specified value at a controller coupled to a second counter specified value input, and providing the second specified value to the second counter specified value input.

In another feature of the invention, the output frequency-increase signal is provided at an output of a first OR gate output where at least one of the PD frequency-increase signal and the SD frequency-increase signal is being provided to the first OR gate.

In another feature, the output frequency-decrease signal is provided at an output of a second OR gate output where at least one of the PD frequency-decrease signal and the SD frequency-decrease signal is being provided to the second OR gate.

DETAILED DESCRIPTION OF THE PREFERRED EMBODIMENT

Many of the disadvantages present with using a typical phase detector and an extended-range phase detector are overcome by using a phase detector having a slip detection circuit and an output circuit. PLL lock times are reduced compared to the typical PD. In voltage-limited applications, the tuning sensitivity of a voltage controlled oscillator (VCO) need not be changed to prevent clipping of a VCO voltage control signal. Additionally, having a controller for selecting a predetermined time period during which a correction is to be made by the slip detection circuit provides versatility, as the controller is able to tailor the phase detector with slip detection circuit to a specific situation. For example, where an operating frequency is altered by several frequency steps, a greater value for the predetermined time period is desired than where the operating frequency is altered by just one or two frequency steps.

Generally, the invention relates to a system and method for implementing a phase detector having a slip detection circuit and an output circuit. Thus, many disadvantages present with using a typical phase detector and an extended-range phase detector are overcome. The invention disclosed further relates to a system and method for using a controller to provide a predetermined time period during which a correction is to be made by the slip detection circuit. Such a controller provides versatility, as the controller is able to tailor the phase detector with slip detection circuit to a specific situation.

In one embodiment of the invention, a slip detection circuit is provided for detecting a cycle slip (slip condition) between a reference signal and a frequency source signal, and forcing a correction to compensate for the detected slip condition. The slip detection circuit improves PLL lock time over a typical digital phase detector (PD). The PLL lock time is reduced without a significant change in the control voltage, as compared with the extended range phase detector, thereby decreasing the chance for clipping of the control voltage signal.

Figure 1:
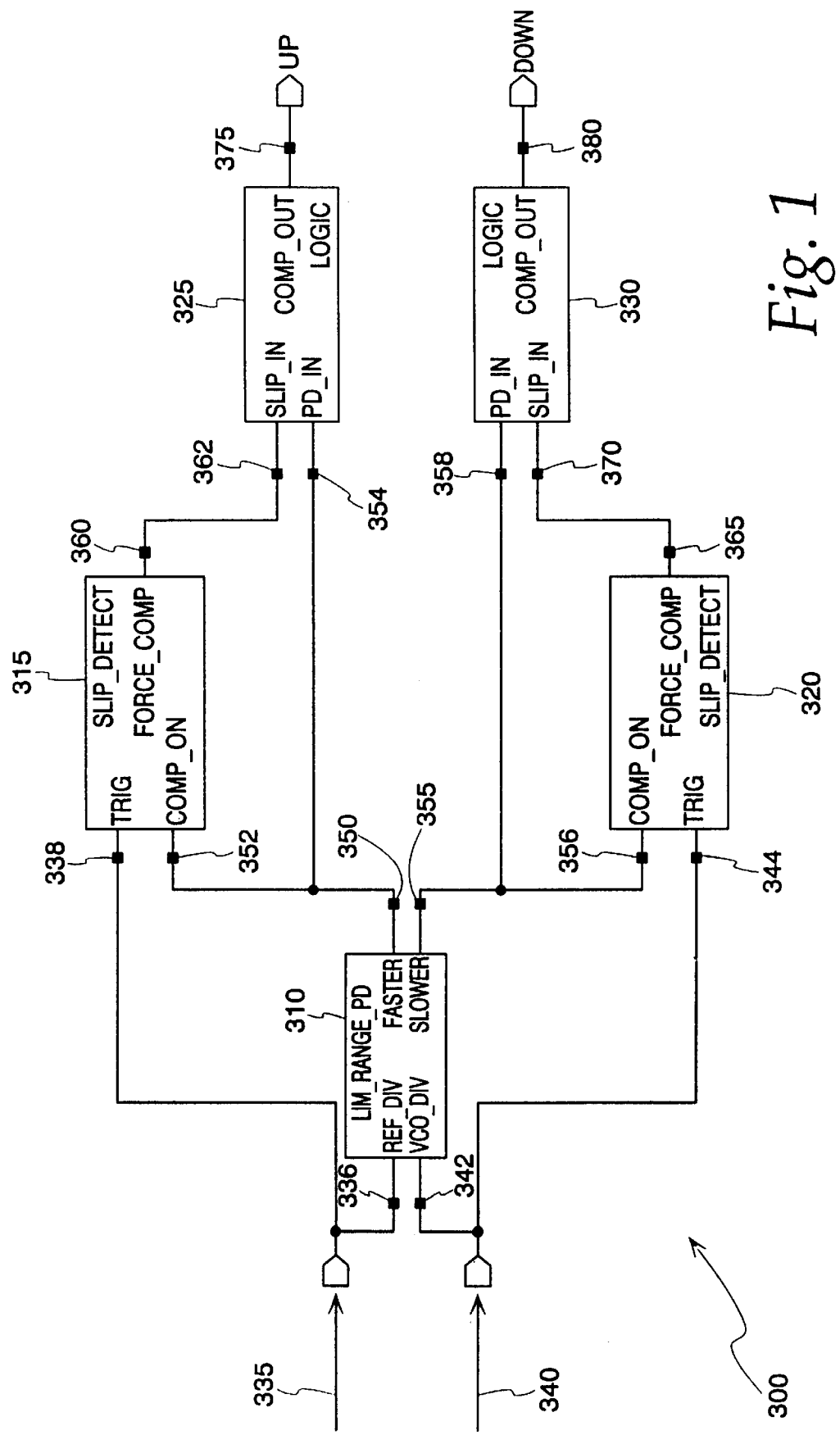
FIG. 1 is a generalized block diagram of a cycle slip detection digital phase detector in accordance with an embodiment of the invention.

FIG. 1 illustrates a cycle slip detection digital phase detector (SDPD) 300 in accordance with an embodiment of the invention. The SDPD 300 includes a phase detector (PD) 310, a first slip detection (SD) circuit 315 and a second SD 320 coupled to the phase detector 310, a first output circuit 325 coupled to the first SD circuit 315 and the PD 310, and a second output circuit 330 coupled to the second SD circuit 320 and the PD 310. A reference signal 335, for example a crystal oscillator signal, is coupled to a PD reference input 336 of the PD 310, and to a first SD trigger input 338 of the first SD 315. A frequency source signal 340, for example a VCO signal, is coupled to a PD frequency source input 342 of the PD 310, and to an second SD trigger input 344 of the second SD 320. The reference signal 335 and the frequency source signal 340 are pulse signals at the frequency of the source, formed by taking the derivative of the respective source signal. A PD frequency-increase output 350 of the PD 310 is coupled to a first SD comparator input 352 of the first SD 315. The PD frequency-increase output 350 is further coupled to a PD frequency-increase input 354 of the first output circuit 325. A PD frequency-decrease output 355 of the PD 310 is coupled to a second SD comparator input 356 of the second SD 320, and to a PD frequency-decrease input 358 of the second output circuit 330. An SD frequency-increase output 360 of the first SD 315 is coupled to an SD frequency-increase input 362 of the first output circuit 325. An SD frequency-decrease output 365 of the second SD 320 is coupled to an SD frequency-decrease input 370 of the second output circuit 330. An output circuit frequency-increase output 375 of the first output circuit 325 is coupled to a charge pump circuit (not shown). An output circuit frequency-decrease output 380 of the second output circuit 330 is also coupled to the charge pump circuit.

In operation, where the reference signal pulse of the reference signal 335 is received at the PD 310 before the frequency source signal pulse of the frequency source signal 340, a PD frequency-increase signal is generated at the PD frequency-increase output 350 for a duration of time equal to the time difference between reception of the reference signal pulse and the frequency source signal pulse at the PD 310. Where the frequency source signal pulse is received at the PD 310 before the reference signal pulse, a PD frequency-decrease signal is generated at the PD frequency-decrease output 355 for a duration of time equal to the time difference between reception of the frequency source signal pulse and the reference signal pulse at the PD 310.

A slip condition is detected at the first SD 315 where the PD frequency-increase signal is detected at the first SD comparator input 352 while the reference signal pulse is received at the first SD trigger input 338. However, because of a propagation delay of the PD 310, the slip condition is not detected by the first SD 315 until a second reference signal pulse of the reference signal 335 is received at the reference input 336 before the frequency source signal pulse is received at the frequency source input 342. Thus, if the second reference signal pulse is received at the reference input 336 before the frequency source signal pulse is received at the frequency source input 342, the second reference signal pulse will be received at the first SD trigger input 338 while the PD frequency-increase signal is being provided to the first SD comparator input 352, thereby causing the first SD 315 to detect the slip condition. When the slip condition is detected at the first SD 315, the SD frequency-increase output 360 provides an SD frequency-increase signal to the first output circuit 325 for a specified, or predetermined time period.

A slip condition is detected at the second SD 320 in the same fashion as at the first SD 315, except the second SD 320 looks at the PD frequency-decrease signal at the second SD comparator input 356 and the frequency source signal pulse at the second SD trigger input 344. When a slip condition is detected at the second SD 320, an SD frequency-decrease signal is provided at the SD frequency-decrease output 365 for the predetermined time period.

The first output circuit 325 provides an output circuit frequency-increase signal to the charge pump where at least one of the SD frequency-increase signal or the PD frequency-increase signal is received at the SD frequency-increase input 362 or the PD frequency-increase input 354 of the first output circuit 325. Similarly, an output circuit frequency-decrease signal is provided at the output circuit frequency-decrease output 380 where at least one of an SD frequency-decrease signal or a PD frequency-decrease signal is received at the SD frequency-decrease input 370 or a PD frequency-decrease input 358 of the second output circuit 330.

The specified, or predetermined time period is a period of time for which a correction must be provided to overcome the slip condition detected by the first SD 315 or the second SD 320. The predetermined time period may be a fixed value provided to the first SD 315 and second SD 320, or may be a variable time period provided to the first SD 315 and the second SD 320 by a controller (not shown). The method used by the controller in determining the predetermined time period is further discussed below in relation to FIG. 4.

Figure 2:
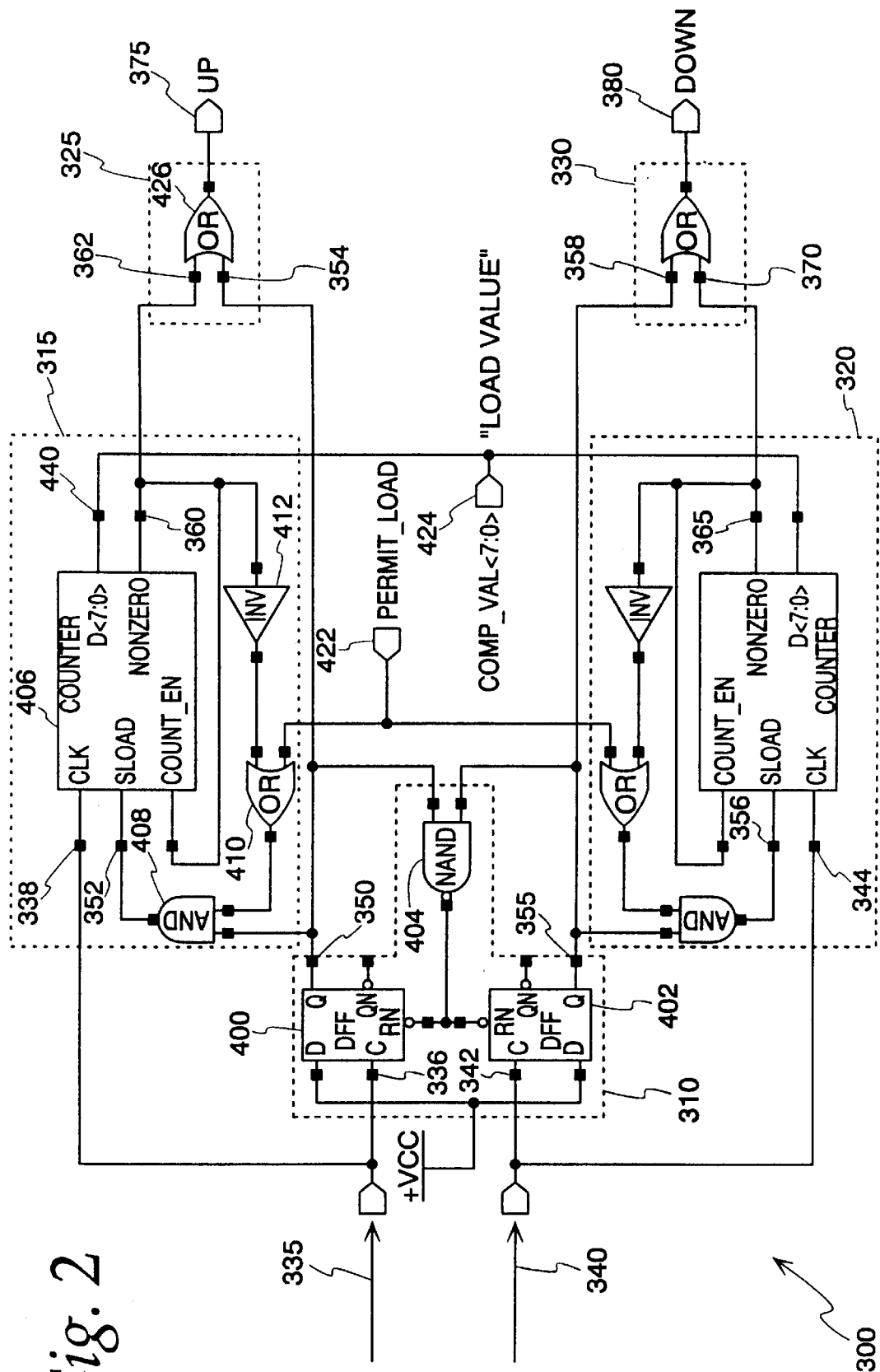
FIG. 2 shows a slip detection digital phase detector circuit of FIG. 1 in greater detail.

FIG. 2 shows the slip detection digital phase detector circuit 300 in greater detail. The PD 310 includes a first edge-triggered D-type flip-flop (DFF) 400, a second edge-triggered DFF 402 and a 2-input NAND gate 404. The PD reference input 336 is a clock input of the first DFF 400, and the PD frequency source input 342 is a clock input for the second DFF 402. The "D" input for the first and second DFF 400 and 402 are coupled to +Vcc ("1"). The PD frequency-increase output 350 is the "Q" output of the first DFF 400, and the PD frequency-decrease output 355 is the "Q" output of the second DFF 402. The PD frequency-increase output 350 is coupled to one of the inputs of the 2-input NAND gate 404, and the PD frequency-decrease output 355 is coupled to the other input of the 2-input NAND gate 404. An output of the NAND gate 404 is coupled to the reset inputs of the first and second DFFs 400 and 402.

The first SD 315 includes an edge-triggered counter 406, here an 8-bit counter sufficient for counting down from 255, a first 2-input AND gate 408, a first 2-input OR gate 410, and a first inverter gate 412. The first SD trigger input 338 is a clock input of the counter 406, the first SD comparator input 352 is an s-load input of the counter 406, and the SD frequency-increase output 360 is the nonzero output of the counter 406, which generates a logic "1" while the counter 406 is counting. The reference signal 335 is coupled to both the PD reference input 336 of the first DFF 400 and to the first SD trigger input 338 of the counter 406. The SD frequency-increase output 360 is coupled to a count enable input of the counter 406, which enables the counter 406 to count while a logical "1" is provided, and to an input of the first inverter gate 412. An output of the inverter gate 412 is coupled to one of the inputs of the 2-input OR gate 410. An output of the OR gate 410 is coupled to one of the inputs of the 2-input AND gate 408. The other input of the 2-input AND gate 408 is coupled to the PD frequency-increase output 350 of the first DFF 400. The output of the AND gate 408 is coupled to the first SD comparator input 352.

A second input of the 2-input OR gate 410 is coupled to a permit-load terminal 422, which may be coupled to a controller (not shown). A counter value input 440 of the counter 406 is coupled to a load value terminal 424, which may also be coupled to the controller. The load value terminal 424 provides a load value to the counter value input 440, which governs the predetermined time period for which a correction will be provided when a slip condition is detected. Although shown as a single signal line, the connection from the counter value input 440 to the load value terminal 424 may be a plurality of lines sufficient for providing a binary load value for the counter 406. For example, where the counter 406 is an 8-bit counter for counting down from 255, eight signal lines would be provided coupling the load value terminal 424 to the counter value input 440.

The second SD 320 is constructed in an identical fashion and will not be described in detail.

The first output circuit 325 includes an output circuit 2-input OR gate 426, where the SD input 362 is one input of the OR gate 426, and the PD input 354 is the other input of the OR gate 426. The SD frequency-increase output 360 is coupled to the SD input 362 of the output circuit OR gate 426, and the PD frequency-increase output 350 is coupled to the PD input 354 of the output circuit OR gate 426. The output circuit frequency-increase output 375 is an output of the OR gate 426, and is coupled to the charge pump circuit (not shown). The second output circuit 330 is constructed in an identical fashion and will not be discussed in detail.

In the preferred embodiment, the first and second DFFs 400 and 402 and the counter 406 are leading edge-triggered, where the DFFs and counter are only triggered on the rising edge of a signal.

When waiting for a slip condition to occur, the SD frequency-increase output 360 is at logical "0", causing a "1" at the output of the inverter gate 412, and in turn providing a logical "1" to one of the inputs of the two-input AND gate 408 via the OR gate 410. At this time, the SDPD 300 acts like the typical phase detector circuit as is known in the art. The slip condition is detected by the first SD 315 when two successive corresponding edges of the reference signal 335, for example leading edges of two successive reference signal pulses of the reference signal 335, are received before a respective corresponding edge of the other signal, for example a leading edge of a frequency source signal pulse of the frequency source signal 340. When the leading edge of the second reference signal pulse is received before the leading edge of the frequency source pulse, the leading edge of the second reference signal pulse is received at the first SD trigger input 338 while a logical "1" is provided at the first SD comparator input 352. Thus, when the PD 310 is providing a correction at the PD frequency-increase output 350 while a reference signal pulse leading edge is received at the first SD trigger input 338, the counter 406 loads the load value provided at the load value input 424, and begins counting from the load value to zero. The SD frequency-increase output becomes logical "1", forcing a correction at the first output circuit 325 for the number of reference signal pulses received at the first SD trigger input 338 equaling the load value.

Because of the propagation delay of the first DFF 400, a leading edge of a first reference signal pulse provided to the first SD trigger input 338 is not present when the PD frequency-increase signal is provided at the PD frequency-increase output 350, preventing the counter 406 from loading the load value provided at the load value terminal 424. However, where the leading edge of the second reference signal pulse is received at the SDPD 300 before the frequency source signal pulse is received at the frequency source input 342, the leading edge of the second reference signal pulse is present at the first SD trigger input 338 while the first AND gate 408 is providing a "1" to the first SD comparator input 352, causing the counter 406 to load the load value and begin counting, thereby forcing the correction.

When the counter 406 is counting, the SD frequency-increase output 360 becomes a "1", providing a "1" to the count enable input of the counter 406, enabling the counter 406 to count down from the load value to zero, clocked by subsequent pulses of the reference signal 335. Further, a "1" present at the SD frequency-increase output 360 provides a zero to the first input of the first OR gate 410 via the inverter 412, thereby providing a zero to one of the inputs of the 2-input AND gate 408, preventing the counter 406 from re-loading the load value from the load value terminal 424 until the counter 406 has completed counting from the load value to zero. While the counter 406 is counting from the load value to zero, the SD frequency-increase output 360 causes the first output circuit 325 to provide the output circuit frequency-increase signal from the output circuit frequency-increase output 375 to the charge pump.

The second SD 320 and second output circuit 330 operate in an identical fashion and will not be discussed.

In a further embodiment, the permit load terminal 422 may provide a "1" to the first OR gate 410, thereby permitting the counter 406 to be reloaded when additional slip conditions are detected at the first SD 315 while a correction is being made. In this embodiment, the permit load terminal 422 may be coupled to a controller (not shown) which provides the value to the permit load terminal 422 based on channel characteristics of the received signal. Alternatively, the permit load terminal may be hardwired to provide a logical "1" or "0".

The load value terminal 424 may be hardwired with a specific load value. Alternatively, the load value terminal 424 may be coupled to the controller, where the controller provides the value to be loaded to the counter 406, further discussed in relation to FIG. 4. In a preferred embodiment, the load value terminal provides a value of 31 to the counter 406, thereby causing a correction lasting 31 reference signal pulses when slip is detected by the first SD 315.

Figure 3:
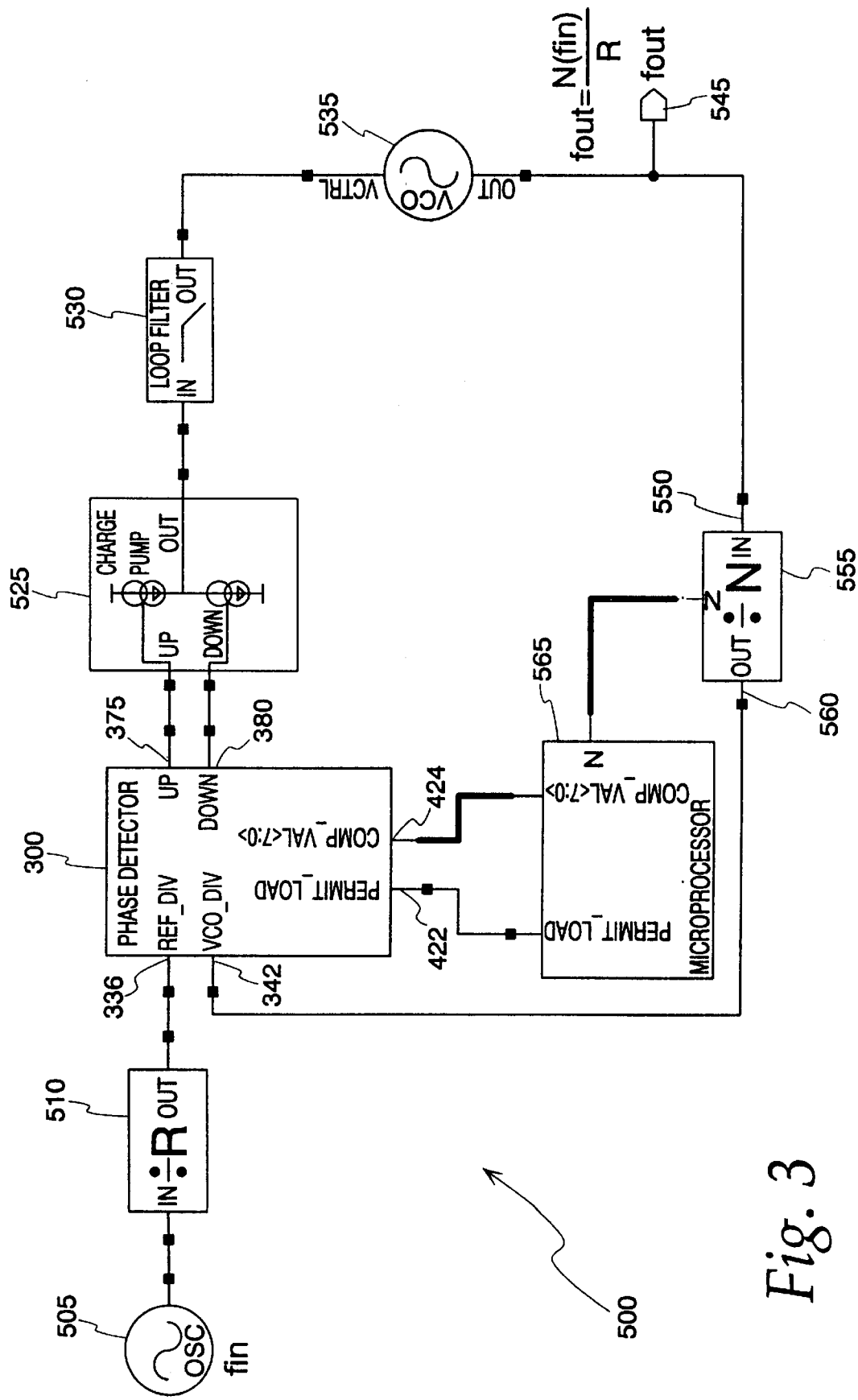
FIG. 3 is a functional block diagram of a phase locked loop using the slip detection digital phase detector in accordance with an embodiment of the invention.

FIG. 3 is a functional block diagram of a PLL 500 using the SDPD 300 in accordance with an embodiment of the invention. In this case, the PLL 500 may be used in a cellular telephone, where the output of the PLL is provided to a mixer in the cellular telephone for mixing a received signal to an intermediate or a baseband frequency. An oscillator 505 for providing a reference signal is coupled to a frequency divider 510, which divides the reference signal by a factor "R", providing the reference signal 335 to the PD reference input 336 of the PD 300. A charge pump 525 is coupled to the output circuit frequency-increase output 375 and the output circuit frequency-decrease output 380. The charge pump 525 is coupled to a loop filter 530 for filtering an output signal from the charge pump 525, for use as a control signal for a VCO 535. An output of the VCO 535 is coupled to an input 550 of a frequency source frequency divider 555, which divides a frequency provided at the input 550 by a value of "N". An output of the frequency source frequency divider 555 is coupled to the frequency source input 342. A controller 565 in the form of a programmed microprocessor is coupled to the permit load terminal 422 and the load value terminal 424, and may provide the load value and/or a permit load signal to the SDPD 300. The controller 540 is further coupled to the output frequency divider 555, providing the value "N" at which the frequency source frequency divider 555 is to operate, as is known by one skilled in the art. The output of the VCO 535 is further coupled to a PLL output 545, which provides a frequency output value of N(fin)/R to a mixer (not shown) for mixing a signal received at the cellular telephone to an intermediate or a baseband frequency, where fin is the frequency provided by the oscillator 505.

Having the slip detection digital phase detector allows a slip condition to be detected, and a correction to be forced for the predetermined time period to compensate for the slip condition. In this way, the PLL lock time is improved over that of a typical digital phase detector without a significant change in the control voltage, as compared with the extended range phase detector, thereby decreasing the chance for clipping of the control voltage.

In another embodiment of the invention, a controller is provided for selecting the predetermined time period during which a correction is to be made by the slip detection circuit. The predetermined time period is governed by the load value determined by the controller. Having the controller which provides a variable load value to the SDPD 300 provides versatility, as the controller is able to tailor the phase detector with slip detection circuit to a specific situation. For example, when the SDPD 300 is used in a cellular telephone, and it is necessary to change the operating frequency of the cellular telephone, alteration of the operating frequency by a small number of frequency channels may require a smaller load value than alteration of the operating frequency of the cellular telephone by several frequency channels.

Figure 4:
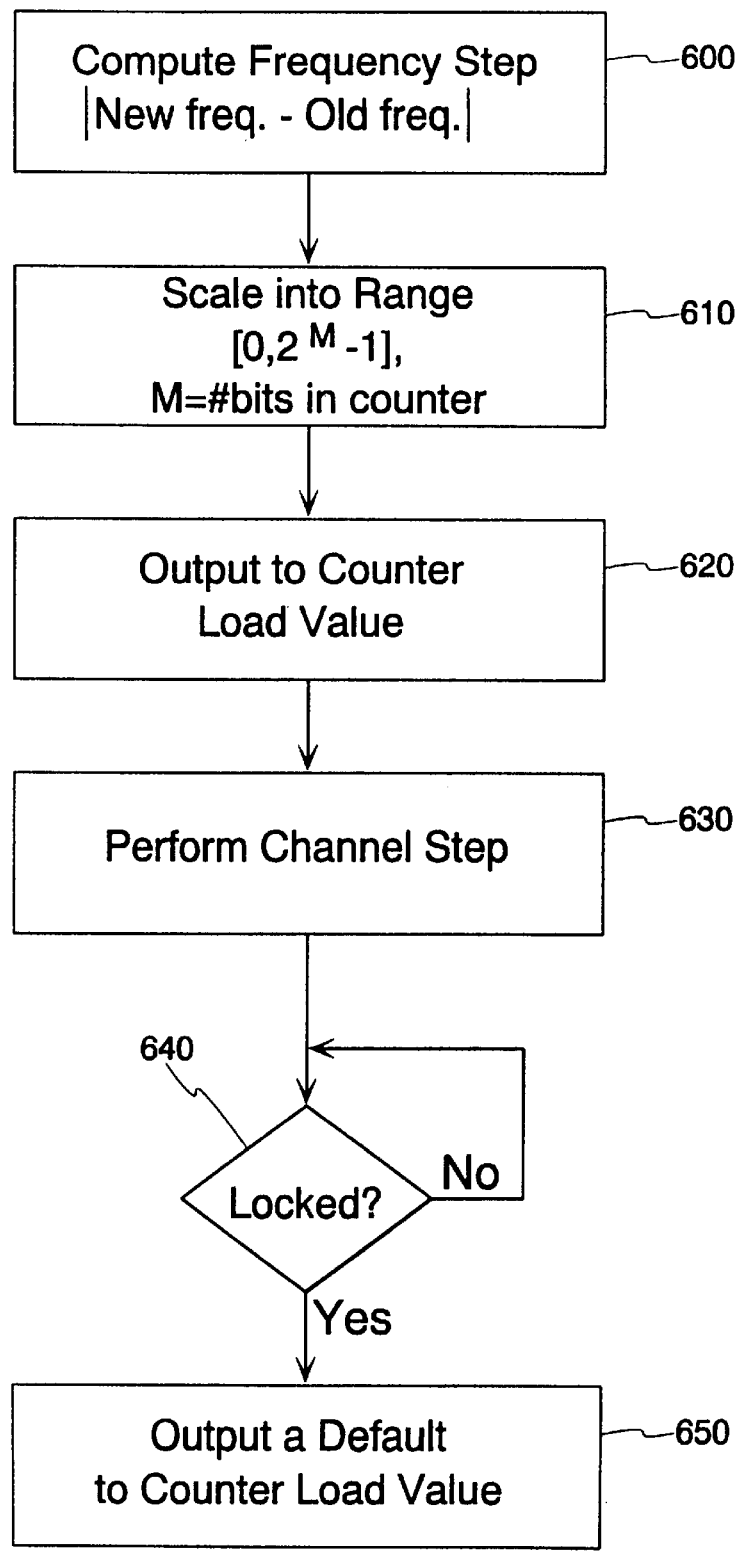
FIG. 4 is a flow chart showing the steps to compute a load value for the slip detection digital phase detector in accordance with an embodiment of the invention.

FIG. 4 is a flow chart showing operation of the controller to compute a load value for the slip detection digital phase detector circuit, in accordance with an embodiment of the invention. At step 600, the frequency step is computed by taking the absolute value of the difference between a new, or target operating frequency and an old, or current operating frequency. The frequency step is scaled into the counter range by determining the load value to be provided to the counter 406 via the load value input 424, as shown in step 610. Step 610 may be accomplished using a table indexed by the frequency step, where a load value is retrieved from the table based on the frequency step determined in step 600. The load values stored in the table may be determined experimentally for the specific system, and the table may include a single load value, or a plurality of load values. Step 610 may also be accomplished using a formula present in the controller, where the load value is a function of the frequency step, and takes into account characteristics of the charge pump, the loop filter and voltage controlled oscillator. The controller then outputs the load value to the counter value input 440 of the counter 406 as shown in step 620. The channel step is then performed, as shown in step 630, where a device in which the SDPD 300 is disposed changes the operating frequency to the target frequency. In step 640, it is determined whether the PLL has locked. A lock detection circuit, known in the art, indicates to the controller whether the PLL has locked. If the PLL has locked, a default load value is provided to the counter of the SDPD 300, shown in step 650, where the default load value is typically much less than the load value determined in step 610. However, if the PLL has not locked, the method returns to step 640, where the SDPD 300 provides corrections until the PLL is determined to have locked.

In an alternate embodiment, the load value provided to the counters 406 and 414 could be changed during the locking transient, for example by halving the load value every 50 us. This would reduce the amount of slip compensation as the frequencies at the phase detector inputs become closer, reducing the chance for voltage overshoot. Further, the permit load terminal 422 could initially be active and switched inactive during the locking transient, preventing the counters from re-loading until the correction made by the first SD 315 or second SD 320 has been completed.

Thus, having the controller which provides a variable load value to the SDPD 300 provides versatility, as the controller is able to tailor the phase detector with slip detection circuit based on the specific operating conditions, for example the change in the frequency step.

One skilled in the art would realize that although the slip detection digital phase detector has been explained in the context of a cellular telephone, the slip detection digital phase detector may be used in any context a digital phase detector is needed, for example, RADAR and computer disk drives.

One skilled in the art would further realize that although the first and second DFFs 400 and 402, and the counter 406 have been described as leading edge-triggered circuits, the first and second DFFs and counter may alternatively be trailing edge-triggered circuits, where the first and second DFFs and counter are triggered by a trailing edge of the signal.

A slip detection digital phase detector is provided having the slip detection circuit which allows a slip condition to be detected, and permits a correction to be forced for the predetermined time period to compensate for the slip condition. PLL lock time is improved over that of a typical digital phase detector (DPD) without a significant change in the control voltage, as compared with the extended range phase detector, thereby decreasing the chance for clipping of the control voltage. Further provided is the controller which provides the predetermined time period for a correction to the SDPD 300. The controller provides versatility, as the predetermined time period may be tailored based on the specific operating conditions, for example the change in the operating frequency.

While particular embodiments of the invention have been described and illustrated, it should be understood that the invention is not limited thereto since modifications may be made by persons skilled in the art. The present application contemplates any and all modifications that fall within the spirit and scope of the underlying invention disclosed and claimed herein.

We claim:

1. An improved digital phase detector (PD) for detecting and compensating for a cycle slip between a reference signal and a frequency source signal, the reference and frequency source signals each comprising pulses, each pulse defined by a leading edge and a trailing edge, the digital PD comprising:

a detector circuit for detecting a cycle slip where two successive corresponding edges of one of the reference and frequency source signals are received before a respective corresponding edge of the other signal is received; and an output circuit operatively coupled to the detector circuit for developing a correction signal responsive to detecting a cycle slip.

2. The improved digital phase detector of claim 1 wherein the detector circuit includes:

a PD for detecting a first edge of the two successive corresponding edges by detecting reception of one of a first frequency source pulse edge and a first reference signal pulse edge, and for developing a PD frequency-increase signal where the first edge is the first reference signal pulse, and developing a PD frequency-decrease signal where the first edge is the first frequency source signal pulse edge; and a slip detection (SD) circuit operatively coupled to the phase detector for receiving the reference and frequency source signals, and for detecting a second corresponding edge of the two successive corresponding edges by detecting a second corresponding reference signal pulse edge corresponding to the first reference signal pulse edge while the frequency-increase signal is being provided, and by detecting a second corresponding frequency source pulse edge corresponding to the first frequency source pulse edge while the frequency-decrease signal is being provided;

wherein an SD frequency-increase signal is developed when the second corresponding reference signal pulse edge is detected, and an SD frequency-decrease signal is developed when the second corresponding frequency source pulse edge is detected.

3. The improved digital phase detector of claim 2 wherein the PD includes a pair of edge-triggered resettable flip-flops and the frequency source signal and the reference signal are clock signals for the flip-flops.

4. The improved digital phase detector of claim 2 wherein the SD circuit includes a first counter and a second counter, wherein the cycle slip is detected at the first counter when the second corresponding reference signal pulse edge is received at a first counter clock input while the PD frequency-increase signal is provided at a first counter comparator input, causing the first counter to load a first specified value and to provide the SD frequency-increase signal at a first counter output for the number of corresponding reference signal pulse edges equaling the first specified value, and the cycle slip is detected at the second counter when the second corresponding frequency source signal pulse edge is received at a second counter clock input while the PD frequency-decrease signal is provided at a second counter comparator input, causing the second counter to load a second specified value and to provide the SD frequency-decrease signal at a second counter output for the number of corresponding frequency source pulse edges equaling the second specified value.

5. The improved digital phase detector of claim 4, wherein the first and second counters each have a permit load input, and including a controller coupled to the permit load inputs for allowing the first and second counters to be loaded while the respective counter is counting.

6. The improved digital PD of claim 4 wherein the first and the second counters each include a counter specified value input, and further including a controller coupled to the specified value inputs for providing the first and second specified values.

7. The improved digital PD of claim 2 wherein the correction signal includes at least one of an output frequency-increase signal and an output frequency-decrease signal, and the output circuit includes:

a first OR logic gate for developing the output frequency-increase signal responsive to the PD frequency-increase signal and the SD frequency-increase signal; and a second OR logic gate for developing the output frequency-decrease signal responsive to the PD frequency-decrease signal and the SD frequency-decrease signal.

8. The improved digital PD of claim 1 including a controller coupled to the detector circuit and the output circuit for controlling duration of the correction signal.

9. The improved digital PD of claim 1 wherein the two successive corresponding edges of one of the reference and frequency source signals are two successive leading edges of one of the reference and frequency source signals, and the respective corresponding edge of the other signal is a leading edge of the other signal.

10. An improved digital phase detector for detecting and compensating for a cycle slip between a reference signal and a frequency source signal, the reference signal and the frequency source signal each comprised of pulses defined by leading edges and trailing edges, including:

a phase detector (PD) for receiving and detecting a phase difference between the reference signal and the frequency source signal, and developing a PD frequency-increase signal where a phase of the frequency source signal is lagging a phase of the reference signal, and a PD frequency-decrease signal where the phase of the frequency source signal is leading the phase of the reference signal;

a slip detection (SD) circuit operatively coupled to the phase detector, for receiving the reference signal and the frequency source signal, and for detecting slip between the reference signal and the frequency source signal, the SD circuit developing a SD frequency-increase signal where the phase detector is providing the PD frequency-increase signal and a reference signal pulse edge is detected by the SD circuit, and a SD frequency-decrease signal where the phase detector is providing the PD frequency-decrease signal and a frequency source signal pulse edge is detected by the SD circuit; and an output circuit operatively coupled to the phase detector and SD circuit for developing an output frequency-increase signal responsive to the PD and SD frequency-increase signals, and an output frequency-decrease signal responsive to the PD and SD frequency-decrease signals.

11. The improved digital phase detector of claim 10 wherein the phase detector includes a pair of edge-triggered resettable flip-flops and the frequency source signal and the reference signal are clock signals for the flip-flops.

12. The improved digital phase detector of claim 10 wherein the SD circuit includes a first counter and a second counter, wherein slip is detected at the first counter when a reference signal pulse edge is received at a first counter clock input while the PD frequency-increase signal is provided by the phase detector, causing the first counter to load a first specified value and provide the SD frequency-increase signal at a first counter output for the number of reference signal pulses equaling the first specified value, and slip is detected at the second counter when a frequency source signal pulse edge is received at a second counter clock input while the PD frequency-decrease signal is provided by the phase detector, causing the second counter to load a second specified value and provide the SD frequency-decrease signal at a second counter output for the number of frequency source signal pulses equaling the second specified value.

13. The improved digital phase detector of claim 12 wherein the first counter includes a first counter specified value input and the second counter includes a second counter specified value input, and further including a controller coupled to the first and second counter specified value inputs for providing the first and second specified values respectively.

14. The improved digital phase detector of claim 12 wherein the first and second counters each have a permit load input, and including a controller coupled to the permit load inputs for allowing the first and second counters to be loaded while the respective counter is counting.

15. The improved digital phase detector of claim 10 wherein the output circuit includes:

a first OR logic gate for developing the output frequency-increase signal responsive to the PD frequency-increase signal and the SD frequency-increase signal; and a second OR logic gate for developing the output frequency-decrease signal responsive to the PD frequency-decrease signal and the SD frequency-decrease signal.

16. A method for detecting and compensating for a cycle slip between a reference signal and a frequency source signal, the reference and frequency source signals each comprising pulses, each pulse defined by a leading edge and a trailing edge, the method comprising:

detecting a cycle slip where two successive corresponding edges of one of the reference and frequency source signals are received before a respective corresponding edge of the other signal; and developing a correction signal responsive to detecting a cycle slip.

17. The method of claim 16 wherein the step of detecting a cycle slip includes:

detecting a first edge of the two successive corresponding edges by detecting reception of one of a first frequency source pulse edge and a first reference signal pulse edge, and developing a PD frequency-increase signal where the first edge is the first reference signal pulse edge, and developing a PD frequency-decrease signal where the first edge is the first frequency source pulse edge; and detecting a second corresponding edge of the two successive corresponding edges by detecting a second corresponding reference signal pulse edge corresponding to the first reference signal pulse edge while the PD frequency-increase signal is being provided, and by detecting a second corresponding frequency source pulse edge corresponding to the first frequency source pulse edge while the PD frequency-decrease signal is being provided, wherein an SD frequency-increase signal is developed when the second corresponding reference signal pulse edge is detected, and an SD frequency-decrease signal is developed when the second corresponding frequency source pulse edge is detected.

18. The method of claim 17 wherein the step of providing the SD frequency-increase signal includes:

loading a first counter with a first specified value where the PD frequency-increase signal is detected at a first counter load input while the second corresponding reference signal pulse edge is detected at a first counter clock input; and providing the SD frequency-increase signal at a non zero output of the first counter while the first counter is counting from the first specified value to zero.

19. The method of claim 18 including the step of permitting the first counter to reload the first specified value while the first counter is counting from the first specified value to zero.

20. The method of claim 18 wherein the step of loading the first counter with the first specified value includes:

determining the first specified value at a controller coupled to a first counter specified value input; and providing the first specified value to the first counter specified value input.

21. The method of claim 17 wherein the step of providing the SD frequency-decrease signal includes:

loading a second counter with a second specified value where the PD frequency-decrease signal is detected at a second counter load input while the second corresponding frequency source pulse edge is detected at a second counter clock input; and providing the SD frequency-decrease signal at a second counter nonzero output while the second counter is counting from the second specified value to zero.

22. The method of claim 21 including the step of permitting the second counter to reload the second specified value while the second counter is counting from the second specified value to zero.

23. The method of claim 21 wherein the step of loading the second counter with the second specified value includes:

determining the second specified value at a controller coupled to a second counter specified value input; and providing the second specified value to the second counter specified value input.

24. The method of claim 17 wherein the step of developing a correction signal includes:

developing an output frequency-increase signal responsive to the PD frequency-increase signal and the SD frequency-increase signal; and developing an output frequency-decrease signal responsive to the SD frequency-decrease signal and the PD frequency-decrease signal.

25. The method of claim 16 wherein the step of developing the correction signal includes controlling the duration of the correction signal.

26. The method of claim 16 wherein the step of detecting a cycle slip where two successive corresponding edges of one of the reference and frequency source signals is received before a respective corresponding edge of the other signal includes detecting the cycle slip where two successive leading edges of one of the reference and frequency source signals is received before a leading edge of the other signal.

27. A method of detecting and compensating for a cycle slip between a reference signal and a frequency source signal in a digital phase detector, the reference signal and the frequency source signal each comprised of pulses defined by leading edges and trailing edges, comprising:

receiving a reference signal pulse and a frequency source signal pulse;

detecting a phase difference and providing a phase detector (PD) frequency-increase signal where a phase of the frequency source signal is lagging a phase of the reference signal, and providing a PD frequency-decrease signal where the phase of the frequency source signal is leading the phase of the reference signal;

providing a slip detector (SD) circuit frequency-increase signal where the PD frequency-increase signal is being provided and a reference signal pulse edge is detected at an SD reference signal input, and providing an SD frequency-decrease signal where the PD frequency-decrease signal is being provided and a frequency source signal pulse edge is detected at an SD frequency source signal input;

responsive to the PD frequency-increase signal and the SD frequency-increase signal, providing an output frequency-increase signal; and responsive to the PD frequency-decrease signal and the SD frequency-decrease signal, providing an output frequency-decrease signal.

28. The method of claim 27 wherein the step of providing the SD frequency-increase signal includes:

loading a first counter with a first specified value where the PD frequency-increase signal is detected at a first counter load input while the reference signal pulse edge is detected at a first counter clock input; and providing the SD frequency-increase signal at a nonzero output of the first counter while the first counter is counting from the first specified value to zero.

29. The method of claim 28 including the step of permitting the first counter to reload the first specified value while the first counter is counting from the first specified value to zero.

30. The method of claim 28 wherein the step of loading the first counter with the first specified value includes:

determining the first specified value at a controller coupled to a first counter specified value input; and providing the first specified value to the first counter specified value input.

31. The method of claim 27 wherein the step of providing the SD frequency-decrease signal includes:

loading a second counter with a second specified value where the PD frequency-decrease signal is detected at a second counter load input while the frequency source signal pulse edge is detected at a second counter clock input; and providing the SD frequency-decrease signal at a second counter nonzero output while the second counter is counting from the second specified value to zero.

32. The method of claim 31 including the step of permitting the second counter to reload the second specified value while the second counter is counting from the second specified value to zero.

33. The method of claim 31 wherein the step of loading the second counter with the second specified value includes:

determining the second specified value at a controller coupled to a second counter specified value input; and providing the second specified value to the second counter specified value input.

34. The method of claim 27 including providing the output frequency-increase signal at an output of a first OR gate output where at least one of the PD frequency-increase signal and the SD frequency-increase signal is being provided to the first OR gate.

35. The method of claim 27 including providing the output frequency-decrease signal at an output of a second OR gate output where at least one of the PD frequency-decrease signal and the SD frequency-decrease signal is being provided to the second OR gate.

* * * * *